United States Patent
Holmqvist et al.

(10) Patent No.: US 9,110,809 B2
(45) Date of Patent: Aug. 18, 2015

(54) REDUCING MEMORY TRAFFIC IN DRAM ECC MODE

(71) Applicant: NVIDIA Corporation, Santa Clara, CA (US)

(72) Inventors: Peter B. Holmqvist, Cary, NC (US); Karan Mehra, Cary, NC (US); George R. Lynch, Raleigh, NC (US); James Patrick Robertson, Austin, TX (US); Gregory Alan Muthler, Austin, TX (US); Wishwesh Anil Gandhi, Sunnyvale, CA (US); Nick Barrow-Williams, San Francisco, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 219 days.

(21) Appl. No.: 13/935,414

(22) Filed: Jul. 3, 2013

(65) Prior Publication Data

US 2015/0012705 A1 Jan. 8, 2015

(51) Int. Cl.
*G06F 12/00* (2006.01)
*G06F 12/08* (2006.01)
*G11C 7/10* (2006.01)

(52) U.S. Cl.
CPC .......... *G06F 12/0842* (2013.01); *G11C 7/1006* (2013.01); *G11C 7/1072* (2013.01)

(58) Field of Classification Search
None
See application file for complete search history.

(56) References Cited

U.S. PATENT DOCUMENTS

| 5,694,576 A | * | 12/1997 | Yamamoto et al. | 711/154 |
| 8,495,338 B2 | * | 7/2013 | Jeddeloh | 711/206 |
| 2014/0189204 A1 | * | 7/2014 | Sugimoto et al. | 711/103 |

* cited by examiner

*Primary Examiner* — Brian Peugh
(74) *Attorney, Agent, or Firm* — Artegis Law Group, LLP

(57) ABSTRACT

A method for managing memory traffic includes causing first data to be written to a data cache memory, where a first write request comprises a partial write and writes the first data to a first portion of the data cache memory, and further includes tracking the number of partial writes in the data cache memory. The method further includes issuing a fill request for one or more partial writes in the data cache memory if the number of partial writes in the data cache memory is greater than a predetermined first threshold.

25 Claims, 7 Drawing Sheets

REDUCING MEMORY TRAFFIC IN DRAM ECC MODE

BACKGROUND OF THE INVENTION

1. Field of the Invention

The present invention generally relates to memory management and, more particularly, to reducing memory traffic in DRAM ECC mode.

2. Description of the Related Art

Computer generated images that include 2D and 3D graphics objects are typically rendered using a graphics processing unit (GPU) with one or more multistage graphics processing pipelines. Such graphics pipelines include various programmable and fixed function stages. Programmable stages include various processing units that execute shader programs to render graphics objects and to generate various visual effects associated with graphics objects.

One element of a memory subsystem within certain processing units is a Level 2 cache memory ("L2 cache"). The L2 cache is a large on-chip cache memory that serves as an intermediate point between an external memory (e.g., frame buffer memory) and internal clients of the memory subsystem. The L2 cache temporarily stores data that the clients are reading from and writing to the external memory, which is often a dynamic random access memory (DRAM). In such systems, coherency has to be maintained between data present in the L2 cache and the data stored in the external memory. "Dirty data," that is, data transferred from a client to the L2 cache during a write operation, needs to remain in the on-chip until the data has been "cleaned," by replicating the data in the external memory.

Dirty data that is transferred to an L2 cache can be checked and verified by utilizing error correcting code (ECC). When DRAM ECC is enabled, an ECC checksum can be computed. In some implementations, computing the ECC checksum requires 32 bytes of data. In such instances, the L2 cache ensures that all dirty data transmitted to DRAM (such as a frame buffer) is fully covered (i.e., the data comprises a full 32 bytes). The frame buffer can then compute the checksum when it receives the data. Because partial writes of less than 32 bytes of data can occur in the L2 cache, the L2 cache system is configured to issue a fill request to the frame buffer for the remaining unwritten bytes so that a full 32 bytes of data is always sent to the frame buffer, which allows the ECC checksum to be computed.

One drawback to the above approach to managing writes from the L2 cache to the frame buffer is that issuing and servicing fill requests consumes a relatively large amount of time and data bandwidth. Consequently, overall system performance can be negatively impacted by the above approach.

As the foregoing illustrates, what is needed in the art is an improved technique for handling partial writes in an L2 cache with ECC enabled.

SUMMARY OF THE INVENTION

One embodiment of the present invention sets forth a method for managing memory traffic. The method includes causing first data to be written to a data cache memory, where a first write request comprises a partial write and writes the first data to a first portion of the data cache memory, and further includes tracking the number of partial writes in the data cache memory. The method further includes issuing a fill request for one or more partial writes in the data cache memory if the number of partial writes in the data cache memory is greater than a predetermined first threshold.

Other embodiments include, without limitation, a subsystem that includes a processing unit configured to implement one or more aspects of the disclosed methods as well as a computing device configured to implement one or more aspects of the disclosed methods.

One advantage of the disclosed techniques is that they enable partial fill requests to be avoided under certain conditions, which reduces both latencies associated with writing data to an off-chip DRAM and memory bandwidth consumption. Consequently, the disclosed techniques improve overall system performance.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

System Overview

Figure 1:
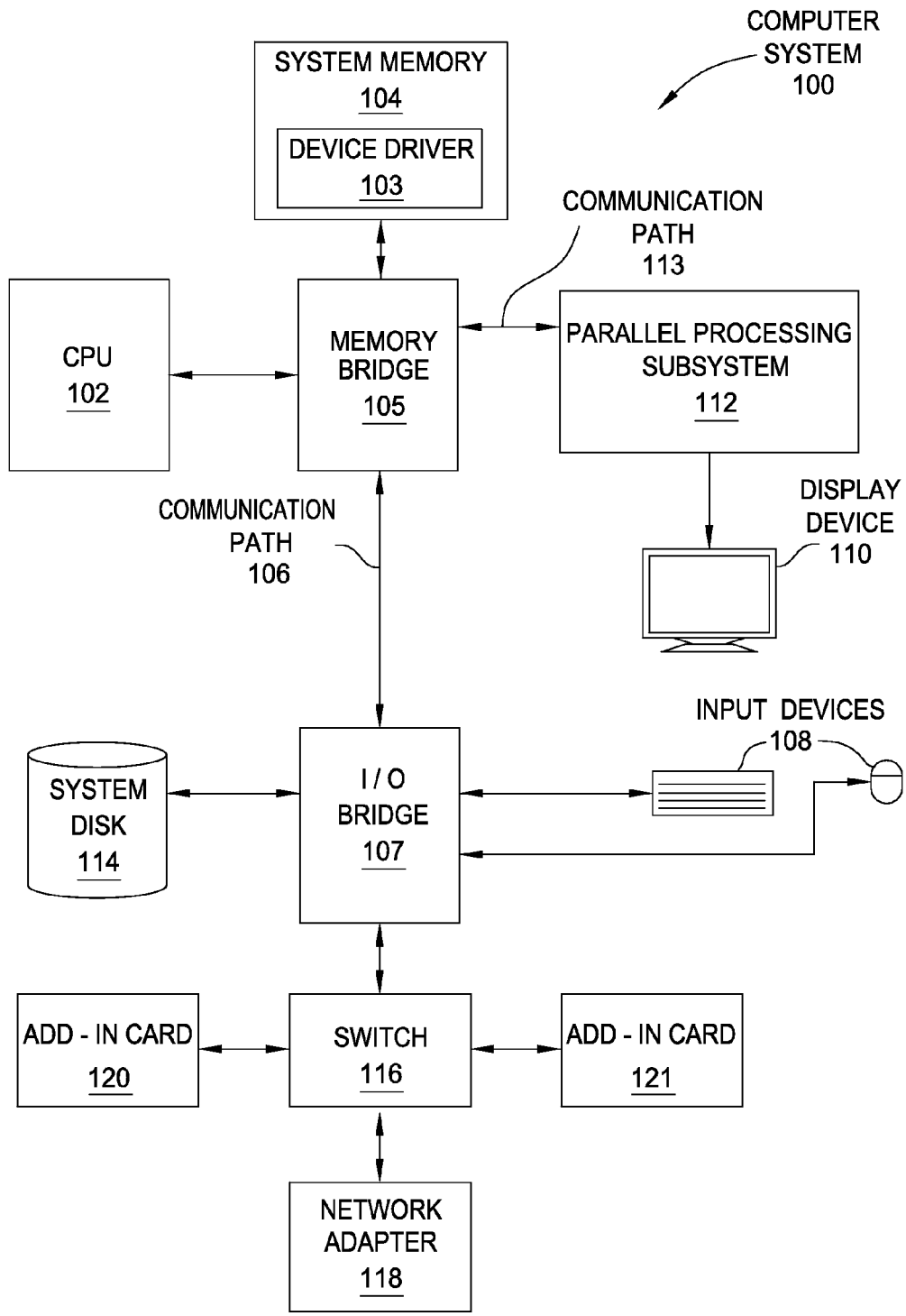
FIG. 1 is a block diagram illustrating a computer system configured to implement one or more aspects of the present invention.

FIG. 1 is a block diagram illustrating a computer system 100 configured to implement one or more aspects of the present invention. As shown, computer system 100 includes, without limitation, a central processing unit (CPU) 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbrige chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry may be incorporated across one or more parallel processing units (PPUs) included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more other the other elements of FIG. 1 to form a single system. For example, parallel processing subsystem 112 may be integrated with CPU 102 and other connection circuitry on a single chip to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
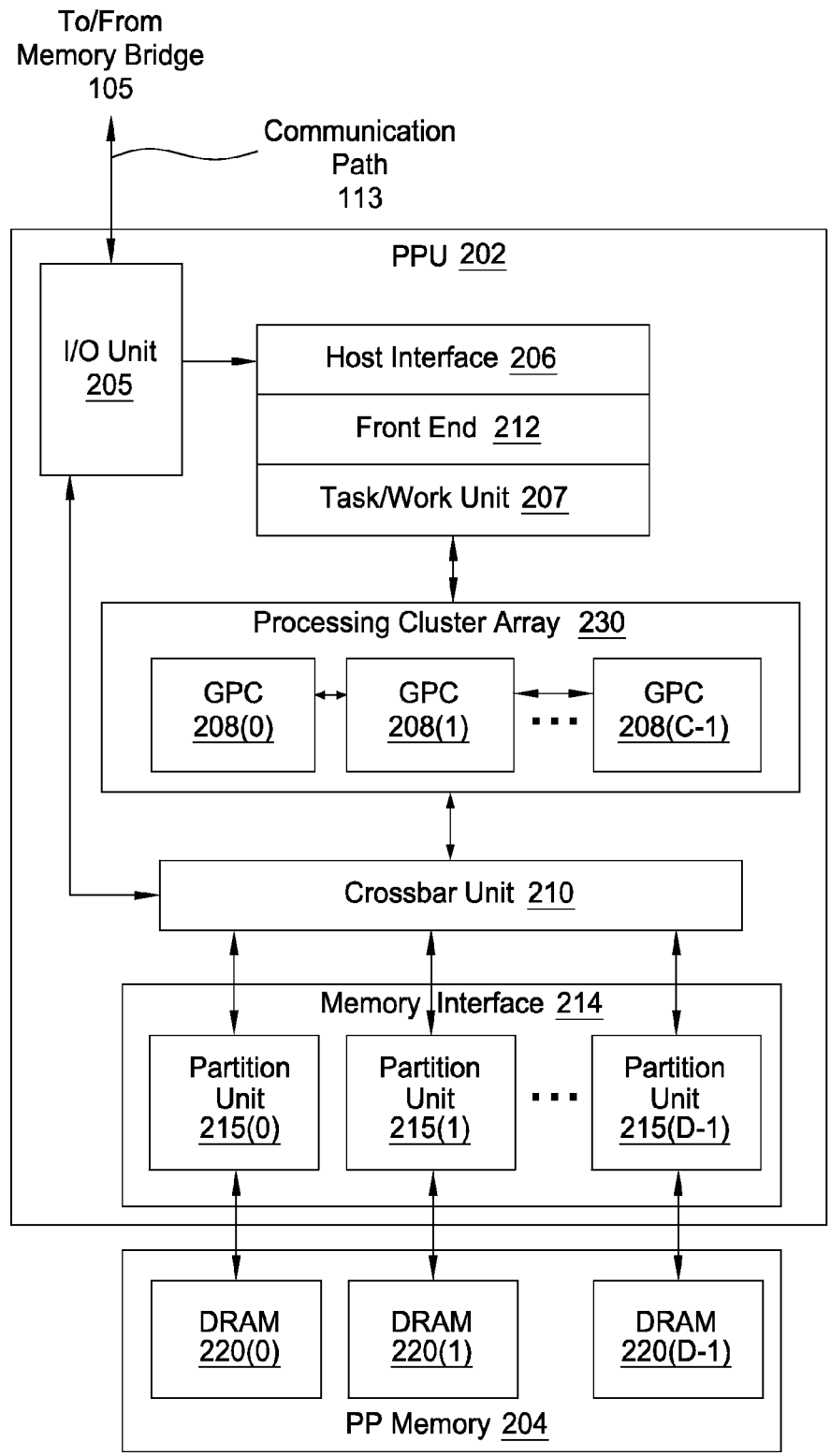
FIG. 2 is a block diagram of a parallel processing unit included in the parallel processing subsystem of FIG. 1, according to one embodiment of the present invention.

FIG. 2 is a block diagram of a parallel processing unit (PPU) 202 included in the parallel processing subsystem 112 of FIG. 1, according to one embodiment of the present invention. Although FIG. 2 depicts one PPU 202, as indicated above, parallel processing subsystem 112 may include any number of PPUs 202. As shown, PPU 202 is coupled to a local parallel processing (PP) memory 204. PPU 202 and PP memory 204 may be implemented using one or more integrated circuit devices, such as programmable processors, application specific integrated circuits (ASICs), or memory devices, or in any other technically feasible fashion.

In some embodiments, PPU 202 comprises a graphics processing unit (GPU) that may be configured to implement a graphics rendering pipeline to perform various operations related to generating pixel data based on graphics data supplied by CPU 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to display device 110 for display. In some embodiments, PPU 202 also may be configured for general-purpose processing and compute operations.

In operation, CPU 102 is the master processor of computer system 100, controlling and coordinating operations of other system components. In particular, CPU 102 issues commands that control the operation of PPU 202. In some embodiments, CPU 102 writes a stream of commands for PPU 202 to a data structure (not explicitly shown in either FIG. 1 or FIG. 2) that may be located in system memory 104, PP memory 204, or another storage location accessible to both CPU 102 and PPU 202. A pointer to the data structure is written to a pushbuffer to initiate processing of the stream of commands in the data structure. The PPU 202 reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

As also shown, PPU 202 includes an I/O (input/output) unit 205 that communicates with the rest of computer system 100 via the communication path 113 and memory bridge 105. I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to PP memory 204) may be directed to a crossbar unit 210. Host interface 206 reads each pushbuffer and transmits the command stream stored in the pushbuffer to a front end 212.

As mentioned above in conjunction with FIG. 1, the connection of PPU 202 to the rest of computer system 100 may be varied. In some embodiments, parallel processing subsystem 112, which includes at least one PPU 202, is implemented as an add-in card that can be inserted into an expansion slot of computer system 100. In other embodiments, PPU 202 can be integrated on a single chip with a bus bridge, such as memory bridge 105 or I/O bridge 107. Again, in still other embodiments, some or all of the elements of PPU 202 may be included along with CPU 102 in a single integrated circuit or system of chip (SoC).

In operation, front end 212 transmits processing tasks received from host interface 206 to a work distribution unit (not shown) within task/work unit 207. The work distribution unit receives pointers to processing tasks that are encoded as task metadata (TMD) and stored in memory. The pointers to TMDs are included in a command stream that is stored as a pushbuffer and received by the front end unit 212 from the host interface 206. Processing tasks that may be encoded as TMDs include indices associated with the data to be processed as well as state parameters and commands that define how the data is to be processed. For example, the state parameters and commands could define the program to be executed on the data. The task/work unit 207 receives tasks from the front end 212 and ensures that GPCs 208 are configured to a valid state before the processing task specified by each one of the TMDs is initiated. A priority may be specified for each TMD that is used to schedule the execution of the processing task. Processing tasks also may be received from the processing cluster array 230. Optionally, the TMD may include a parameter that controls whether the TMD is added to the head or the tail of a list of processing tasks (or to a list of pointers to the processing tasks), thereby providing another level of control over execution priority.

PPU 202 advantageously implements a highly parallel processing architecture based on a processing cluster array 230 that includes a set of C general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

Memory interface 214 includes a set of D of partition units 215, where D≥1. Each partition unit 215 is coupled to one or more dynamic random access memories (DRAMs) 220 residing within PPM memory 204. In one embodiment, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

A given GPCs 208 may process data to be written to any of the DRAMs 220 within PP memory 204. Crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In one embodiment, crossbar unit 210 has a connection to I/O unit 205, in addition to a connection to PP memory 204 via memory interface 214, thereby enabling the processing cores within the different GPCs 208 to communicate with system memory 104 or other memory not local to PPU 202. In the embodiment of FIG. 2, crossbar unit 210 is directly connected with I/O unit 205. In various embodiments, crossbar unit 210 may use virtual channels to separate traffic streams between the GPCs 208 and partition units 215.

Again, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, etc. In operation, PPU 202 is configured to transfer data from system memory 104 and/or PP memory 204 to one or more on-chip memory units, process the data, and write result data back to system memory 104 and/or PP memory 204. The result data may then be accessed by other system components, including CPU 102, another PPU 202 within parallel processing subsystem 112, or another parallel processing subsystem 112 within computer system 100.

As noted above, any number of PPUs 202 may be included in a parallel processing subsystem 112. For example, multiple PPUs 202 may be provided on a single add-in card, or multiple add-in cards may be connected to communication path 113, or one or more of PPUs 202 may be integrated into a bridge chip. PPUs 202 in a multi-PPU system may be identical to or different from one another. For example, different PPUs 202 might have different numbers of processing cores and/or different amounts of PP memory 204. In implementations where multiple PPUs 202 are present, those PPUs may be operated in parallel to process data at a higher throughput than is possible with a single PPU 202. Systems incorporating one or more PPUs 202 may be implemented in a variety of configurations and form factors, including, without limitation, desktops, laptops, handheld personal computers or other handheld devices, servers, workstations, game consoles, embedded systems, and the like.

Figure 3:
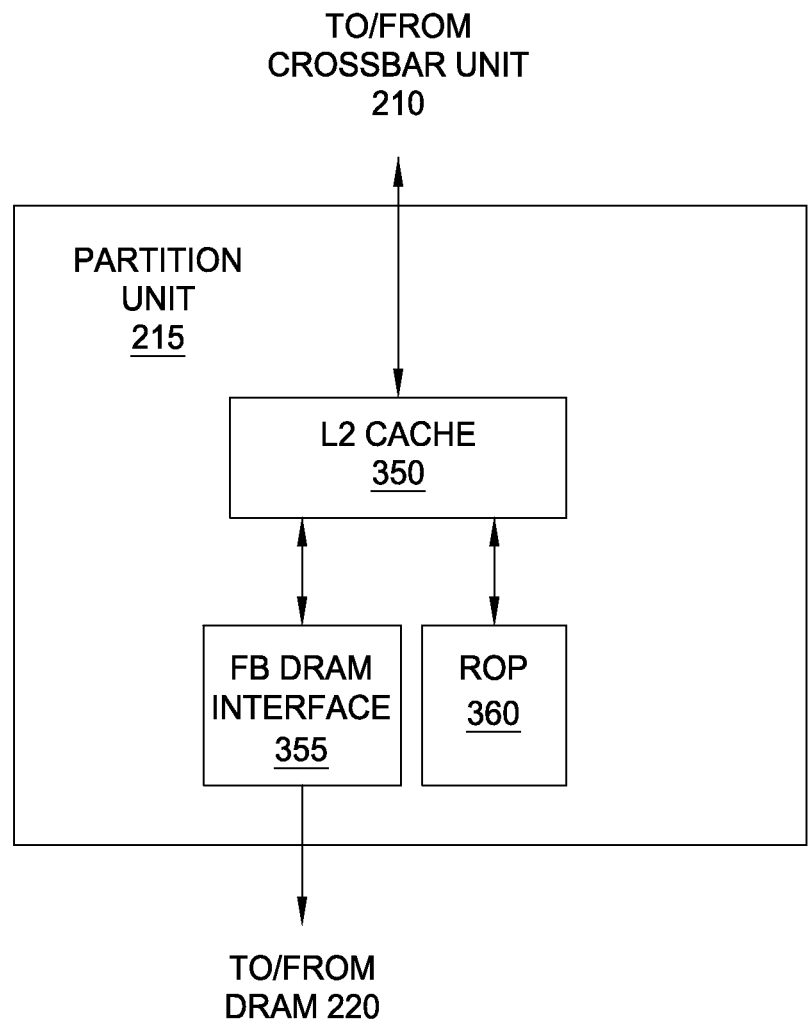
FIG. 3 is a block diagram of a partition unit within one of the PPUs of FIG. 2, according to one embodiment of the invention.

FIG. 3 is a block diagram of a partition unit 215 within one of the PPUs 202 of FIG. 2, according to one embodiment of the present invention. As shown, partition unit 215 includes a L2 cache 350, a frame buffer (FB) DRAM interface 355, and a raster operations unit (ROP) 360. L2 cache 350 is a read/write cache that is configured to perform load and store operations received from crossbar unit 210 and ROP 360. Read misses and urgent writeback requests are output by L2 cache 350 to FB DRAM interface 355 for processing. Dirty updates are also sent to FB 355 for opportunistic processing. FB 355 interfaces directly with DRAM 220, outputting read and write requests and receiving data read from DRAM 220.

In graphics applications, ROP 360 is a processing unit that performs raster operations, such as stencil, z test, blending, and the like, and outputs pixel data as processed graphics data for storage in graphics memory. In some embodiments of the present invention, ROP 360 is included within each GPC 208 instead of partition unit 215, and pixel read and write requests are transmitted over crossbar unit 210 instead of pixel fragment data.

The processed graphics data may be displayed on display device 110 or routed for further processing by CPU 102 or by one of the processing entities within parallel processing subsystem 112. Each partition unit 215 includes a ROP 360 in order to distribute processing of the raster operations. In some embodiments, ROP 360 may be configured to compress z or color data that is written to memory and decompress z or color data that is read from memory.

Reducing Memory Traffic in DRAM ECC Mode

DRAM ECC may be enabled to provide ECC protection of data. In this mode, an L2 cache, such as L2 cache 350 illustrated in FIG. 3, ensures that all dirty data spilled to the frame buffer (such as a DRAM 220 in FIG. 2) is fully covered. Fully covered data ensures that the frame buffer can immediately compute the ECC checksum, because all 32 bytes of data are needed to compute the ECC checksum. In some embodiments, 2 bytes of ECC data may be computed for every 32 bytes of data.

Byte enables may also be implemented in certain situations. Byte enables allow data to be written to only a specific portion of a sector of data. For example, using byte enables, a 16-byte portion of a 32-byte sector may be marked as valid, and the remaining 16 bytes invalid. When these portions are invalid, the ECC cannot be calculated.

In situations where byte enables are used and data is only written to a specific portion of a sector (the valid bytes), data stored in the 32-byte sector corresponding to the invalid bytes must be pulled from memory so that the ECC can be calculated. The invalid bytes are read from memory (the frame buffer) and merged with the data written to the specific portion of the sector. This is known as a fill request. The ECC can then be calculated using all 32 bytes, and the entire 32-byte sector can be written to the frame buffer. However, performing these read-merge-write steps consumes time and creates unnecessary data traffic. It also creates control traffic.

Certain embodiments of the present invention can reduce or eliminate these read-write-merge operations by allowing some cache lines or sectors in an L2 cache to contain partial data without having a fill request issued. Other incoming partial write requests can then be used to coalesce with the partially written sectors to create fully covered data, and the fully covered data can then be written to the frame buffer. This process avoids an unnecessary fill request, thereby saving time and bandwidth.

Figure 4:
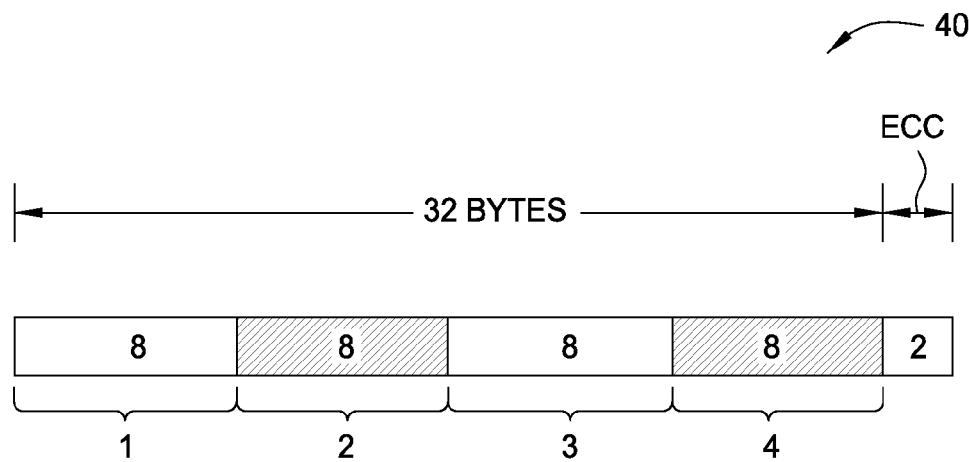
FIG. 4 illustrates an example data sector.

FIG. 4 illustrates an example 32-byte sector 402 comprising 4 8-byte portions according to an embodiment of the present invention. A 2-byte ECC checkbit for the 32 bytes of data is also shown. In this example, portions 2 and 4 are marked as valid using the byte enables. When data is written to portions 1 and 3, they will become valid and marked as such by the byte enables. Writing fewer than 32 bytes to a 32-byte sector such as this one is known as a partial write. Any number or combination of the 32 bytes can be byte-enabled, and in other embodiments other sector sizes may be utilized.

During an example partial write operation, a total of 16 bytes of data is written to portions 2 and 4 of the sector. Calculating an ECC checksum requires the use of all 32 bytes of data in the sector. The L2 cache therefore issues a fill request to pull data from the DRAM for the remaining unwritten bytes in portions 1 and 3. The data for portions 1 and 3 is written to the sector and a full 32 bytes of data is sent to the frame buffer, which can then compute the ECC checksum. However, as noted above, the read-write-merge process takes up time and data bandwidth.

In accordance with certain embodiments of the present invention, the fill operation can be delayed after a partial write occurs in a sector. During the delay, a second partial write may be used to complete the sector and create a full write (also known as fully written data, a fully covered write, or fully covered data). The data in the sector can then be sent to the frame buffer as a full write and an ECC checksum can be calculated without using the read-write-merge process as described above.

In one example operation, first data enters an L2 cache, and a first write request comprising a partial write writes the first data to a first portion of the data cache memory. In this example, the first data comprises 16 bytes of data, and a first cache line comprises 128 bytes. A first sector of the first cache line comprises 32 bytes. Byte enables allow a portion of the 32-byte sector to remain invalid. A write request comprising less than 32 bytes in a sector is known as a partial write. Byte enables are used in this example to mark as valid 16 of the 32 bytes in the sector, when the 16 bytes of first data are written to a portion of the first sector (i.e., a first portion of the first sector or a first portion of the data cache memory).

Second data comprising 16 bytes of data enters the L2 cache and is written to a first portion of a second 32-byte sector. The second sector may be located in the first cache line or in another cache line. The second sector may also employ byte enables. In this example, 16 bytes in the second 32-byte sector are marked as valid and 16 bytes are invalid.

Third data comprising 16 bytes of data may enter the L2 cache. This third data can coalesce with one of the previously partially written lines instead of being written to another portion of memory. For example, the third data may be stored in a second portion of the first sector so as to create a fully covered sector with the first data. Thus, two partial writes have been written to the first sector to create a fully covered write, and the full 32-byte sector can then be written to DRAM. As subsequent partial writes enter the L2 cache, those partial writes may also be used to complete a full write by coalescing with an existing partially written line or may be stored as a partial write in another sector and/or cache line.

Logic in a tag lookup unit can be used to track the data in the L2 cache. The tag lookup unit can cause data to be written to the data cache memory. The tag lookup unit can track which bytes in a sector have new data associated with them. The tag lookup unit also knows which sectors contain dirty or partial data. The tag lookup unit can track byte enables and can count the number of partial lines in the L2 cache, as described in further detail below. Any time new data enters the L2 cache or any time data is written to the DRAM the tag lookup unit can update the count of the number of partial lines in the L2 cache.

An L2 line state can be used to track which lines in an L2 cache contain partially written data. The number of outstanding partially written lines can also be tracked. Fill requests for these partially written lines can be delayed until new partial write requests enter the L2 cache. As described above, these new requests can coalesce with the existing partially written lines to create a fully written sector. A threshold known as a partial_fill threshold can determine how many lines in an L2 set can contain partial data before a fill request is issued for one or more of the partial lines. Other write requests can enter the data cache memory and coalesce with partially written lines, whether the number of partially written lines is above or below the partial_fill threshold.

A second threshold can also be utilized in certain embodiments. The second threshold, known as max_partial threshold, is a hard limit on the number of partial lines at any one time in the L2 cache. If the max_partial threshold is exceeded, fills are immediately requested for new writes that could be partial. Partially dirty lines below the partial_fill threshold remain open to coalesce with other partial writes and potentially become fully covered, saving the time and bandwidth of a fill request. The max_partial threshold works to avoid the situation where a large portion of an L2 cache is locked down by partial data.

The thresholds described above can be determined per cache line instead of per sector. For example, if a cache line has two partially covered sectors that would count as "one" toward the thresholds.

Returning to the example embodiment described above, each time a new partial write enters the L2 cache the tag lookup unit can update the count of partially written lines in the cache. The tag lookup unit can continuously or periodically compare the count of partially written lines to the two thresholds described above. When a new partial write coalesces with an existing partial write and the fully covered line is written to the frame buffer, the tag lookup unit can update the count of partially written lines. If a fill request is completed, the tag lookup unit can update the count of partially written lines. When the partial_fill threshold is reached, the tag lookup unit can issue fill requests for an existing partially filled line. In some embodiments, the fill request can be issued for the oldest partially filled line.

As partial writes continue to enter the L2 cache, the max_partial threshold may be reached. When the max_partial threshold is reached, fill requests are immediately issued for each new partial write that enters the L2 cache. Issuing these fill requests slows or stops the rate at which partial data is built up in the L2 cache. The max_partial threshold works to prevent a large portion of the L2 cache being locked down with partial data.

Figure 5:
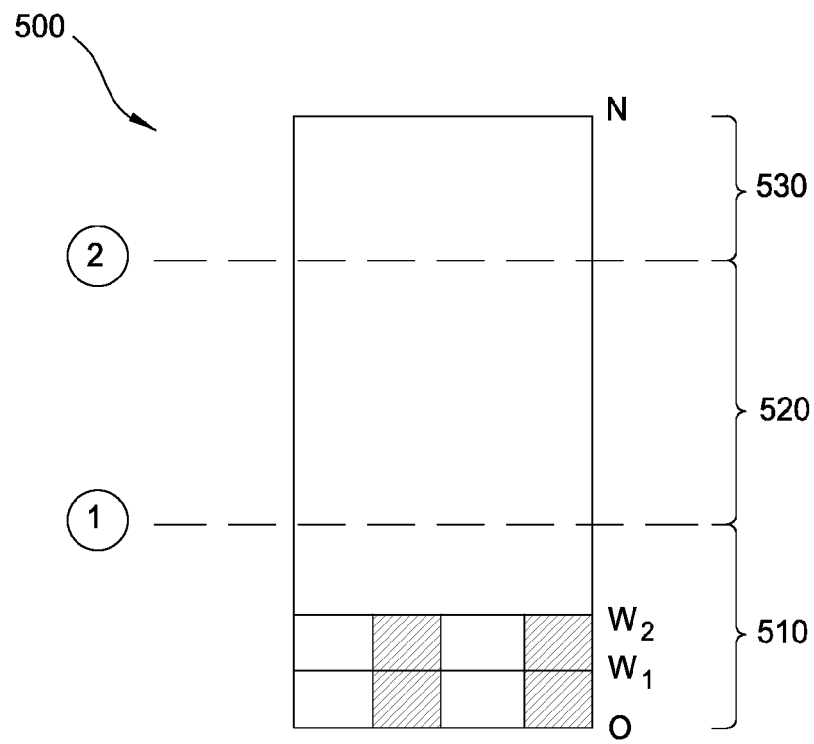
FIG. 5 illustrates an example diagram of partial data thresholds.

FIG. 5 illustrates an example diagram 500 of the thresholds according to one embodiment of the present invention. FIG. 5 illustrates the number of partially filled lines from 0 to N, where N denotes an N-way set associative cache (such as a 16-way set associative cache). For purposes of illustration, W1 and W2 represent two cache lines that are partially filled. When the number of partially filled cache lines is below threshold 1 (the partial_fill threshold), partial fills can accumulate. In other words, the read-merge-write operations are suppressed below threshold 1. This behavior is represented by section 510.

When the number of partially filled cache lines is above the partial_fill threshold, fill requests are issued for the oldest partial line, while new partial writes continue to accumulate. This behavior occurs in section 520.

When the number of partially filled cache lines is above threshold 2 (the max_partial threshold), fill request are issued immediately for each new partial write that comes in. This prevents or slows down the build-up of more partial data in the cache. This behavior occurs in section 530.

In some embodiments, thresholds are tracked individually per cache set. In other embodiments, thresholds can be tracked across any number of lines in the cache.

Figure 6:
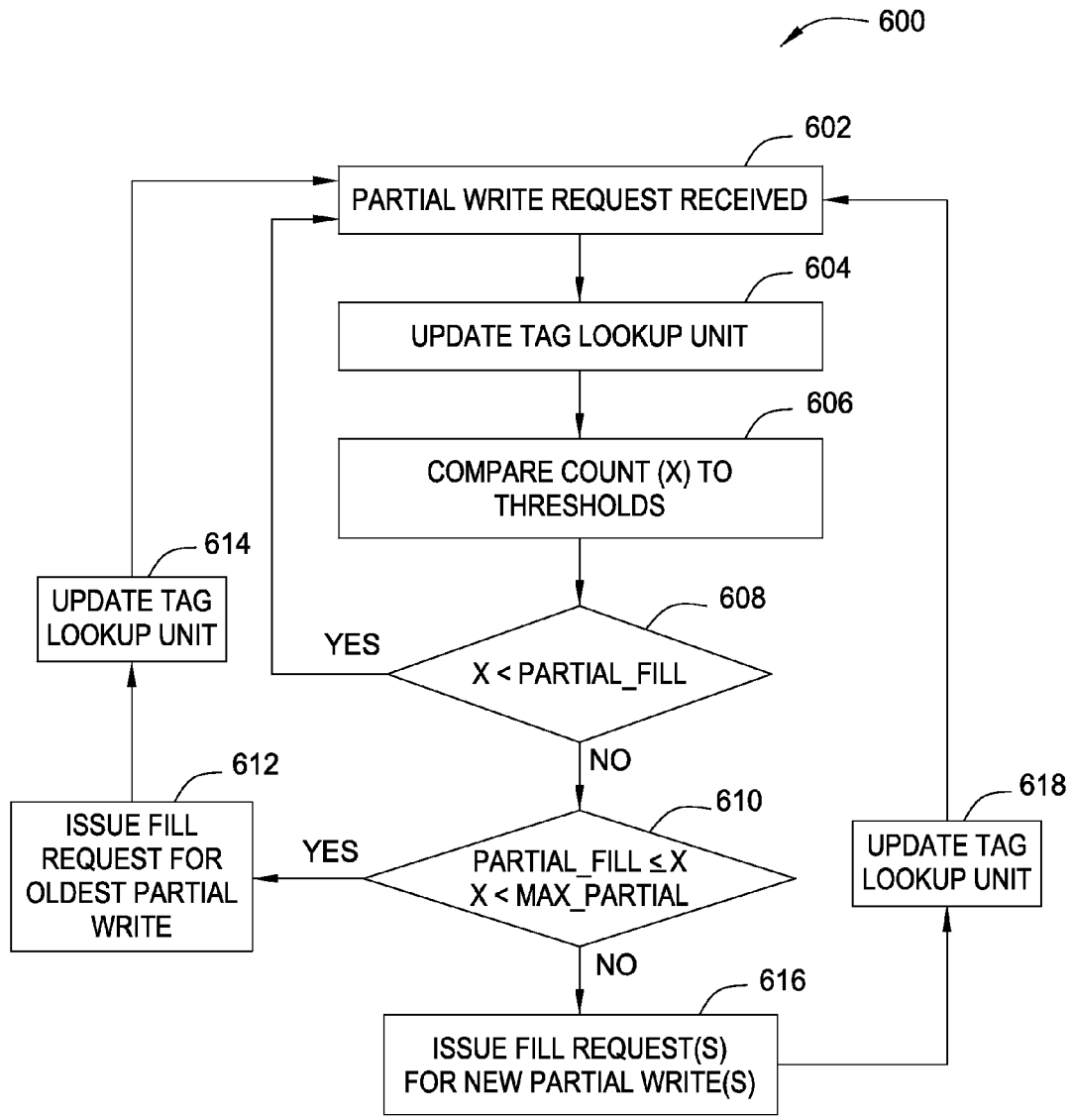
FIG. 6 is a flowchart illustrating steps for managing partial writes and avoiding unnecessary write traffic in a graphics processing system.

FIG. 6 sets forth a flow diagram of method steps for managing partial writes and avoiding unnecessary write traffic in a graphics processing system, according to one embodiment of the present invention. Although the method steps are described in conjunction with the systems of FIGS. 1-5, persons of ordinary skill in the art will understand that any system configured to perform the method steps, in any order, is within the scope of the inventions.

As shown, a method 600 begins at step 602, where a partial write request is received at an L2 cache (such as L2 cache 350 illustrated in FIG. 3) and the partial data is allocated to a sector in a cache line. The partial write request may be allocated to a sector that is available or it may be allocated to a sector comprising previous partial data in order to create fully covered data. In step 604, the tag lookup unit updates the information it tracks about the L2 cache. This information includes, but is not limited to, which bytes in a sector have new data associated with them, which sectors contain dirty or partial data, and a count (represented by "X") of the number of partially filled lines in the cache. If the incoming partial write request is stored as partial data in a sector that was not partial before the write request, the count is incremented. If the incoming partial write request is allocated to a sector comprising previous partial data in order to create fully covered data, the fully covered data is transmitted to the frame buffer and the count is decremented. If the incoming partial write request is stored as partial data in a sector that was already partial before the write request, the count is not incremented.

At step 606, the tag lookup unit compares the count of the number of partially filled lines in the cache to the first threshold (the partial_fill threshold) and the second threshold (max_partial threshold). If the count is below the first threshold, incoming partial writes are allowed to accumulate or coalesce as in step 602. This comparison is represented by step 608 in FIG. 6.

If the count is above the first threshold but below the second threshold (as shown in step 610), the tag lookup unit issues a fill request for the oldest partial write in the L2 cache as illustrated in step 612. When the count is between the two thresholds, new partial writes are allowed to be written into the L2 cache so that some of them may coalesce; however, at the same time, fill requests are issued for the oldest partial write to partially prevent the L2 cache from filling up with partial data. The fill request in step 612 may take a relatively large amount of time to complete. Once the fill request has completed the read-merge operation with data from the frame buffer, the fully covered data can then be spilled to the frame buffer, and an ECC checksum can be computed. Spilling this data to the frame buffer would reduce the count of partially filled lines by 1, and the tag lookup unit would update the count as in step 614. The process described thus far could begin again when a new partial write request is received in the L2 cache as shown in step 602.

If the count is above both the first threshold and the second threshold, method 600 proceeds to step 616. In step 616, fill requests are issued by the tag lookup unit for all new partial writes that enter the L2 cache, and these fill requests continue to be issued as new partial writes enter the cache until the count falls below the max_partial threshold. The tag lookup unit updates the count of partial lines in step 618 as the fill requests are completed and as new partial writes enter the cache. The method 600 could also continue as shown in step 602 when a new partial write is received.

Figure 7:
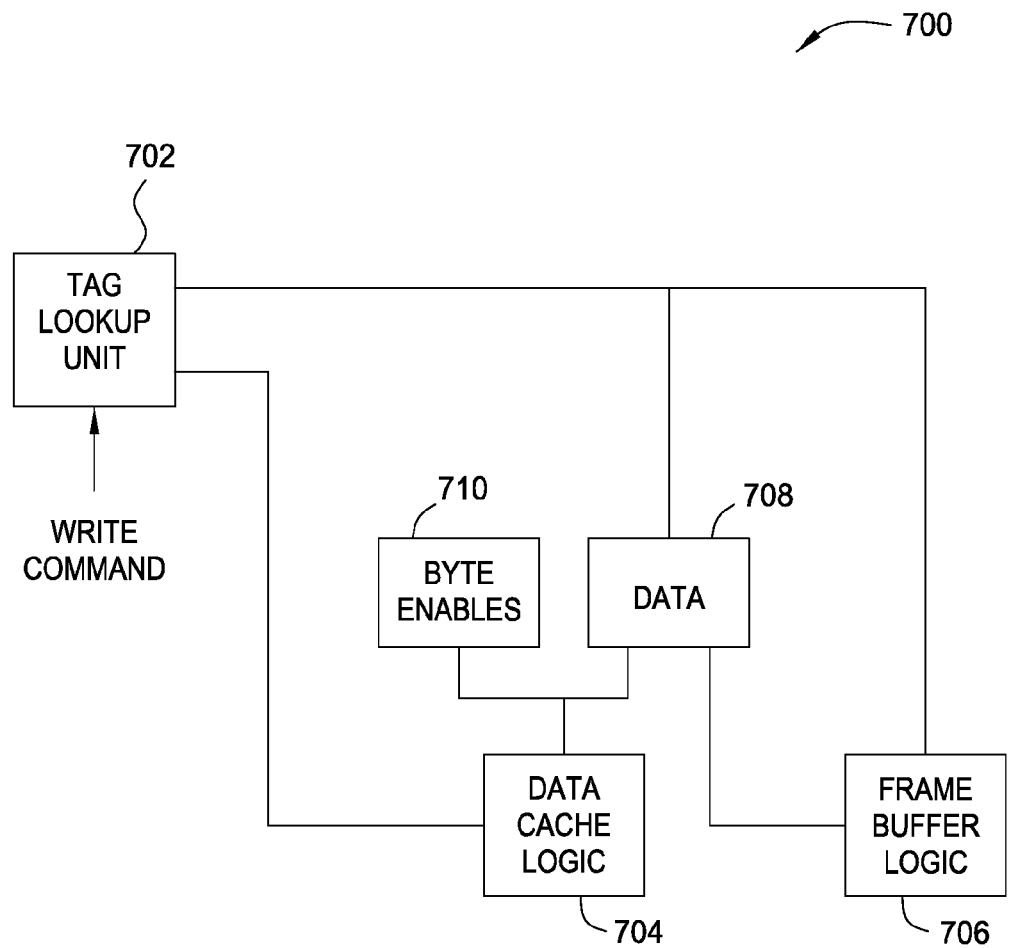
FIG. 7 illustrates one example diagram of certain components of a system configured to implement various embodiments of the present disclosure.

FIG. 7 illustrates one example diagram of certain components of a system according to one embodiment of the present invention. Other components and logic blocks besides those shown may be present in certain other embodiments. Subsystem 700 comprises, in part, tag lookup unit 702. Logic in tag lookup unit 702 can track and manage a variety of information about system 700. Tag lookup unit 702 can track which bytes in a sector in the data cache memory have new data associated with them. Tag lookup unit 702 can also track information about data stored in the data cache memory, such as which sectors contain dirty or partial data. Tag lookup unit 702 can count the amount of dirty data in a cache memory and perform the threshold compares, as described above, to see if a threshold has been met. Tag lookup unit 702 also performs a number of other operations as described elsewhere in this disclosure.

In system 700, data 708 comprises the data stored in data cache memory and byte enables 710 comprises the byte enable information for the data cache memory. Byte enables 710 and data 708 can each be stored in a RAM comprising various configurations. In one example operation, a write command is received by tag lookup unit 702. Data cache logic 704 can analyze the byte enables 710 related to that write command. Data cache logic 704 can also analyze the data 708 stored in the data cache memory. Data cache logic 704 can compare byte enables to see if a partial fill can be completed to a full 32 bytes. Byte enables 710 can be updated when appropriate.

When a portion of data cache memory is filled to complete fully valid data, a partial state bit can be removed from that portion. Data cache logic 704 can notify tag lookup unit 702 that the specific portion is valid and ready to be written to memory, such as a frame buffer. Tag lookup unit 702 can reduce the partial fill count and notify frame buffer logic 706 that the portion is ready to be written to the frame buffer. Frame buffer logic 706 can transmit the data to the frame buffer and compute an ECC checksum. Appropriate portions of the process described above can be repeated when new write commands are received by tag lookup unit 702.

In certain implementations, exposing fully valid dirty lines to the frame buffer can sometimes cause unnecessary write traffic to the DRAM. Situations may arise where a partially filled line becomes fully covered by a subsequent partial write, but a fill request has already been issued. In this case, the fully covered line may be spilled to the frame buffer while the fill request is in process. Then, at a later time, the fill request is completed, and the data is again spilled to the frame buffer. Consequently, the same data is sent to the frame buffer twice, which results in wasted time and unnecessary bandwidth use.

One solution to prevent this unnecessary write traffic is to refrain from exposing dirty data to the frame buffer for a write request for which a fill has been issued. Instead, the system can wait to expose the dirty data until the fill data is returned from the frame buffer.

Figure 8:
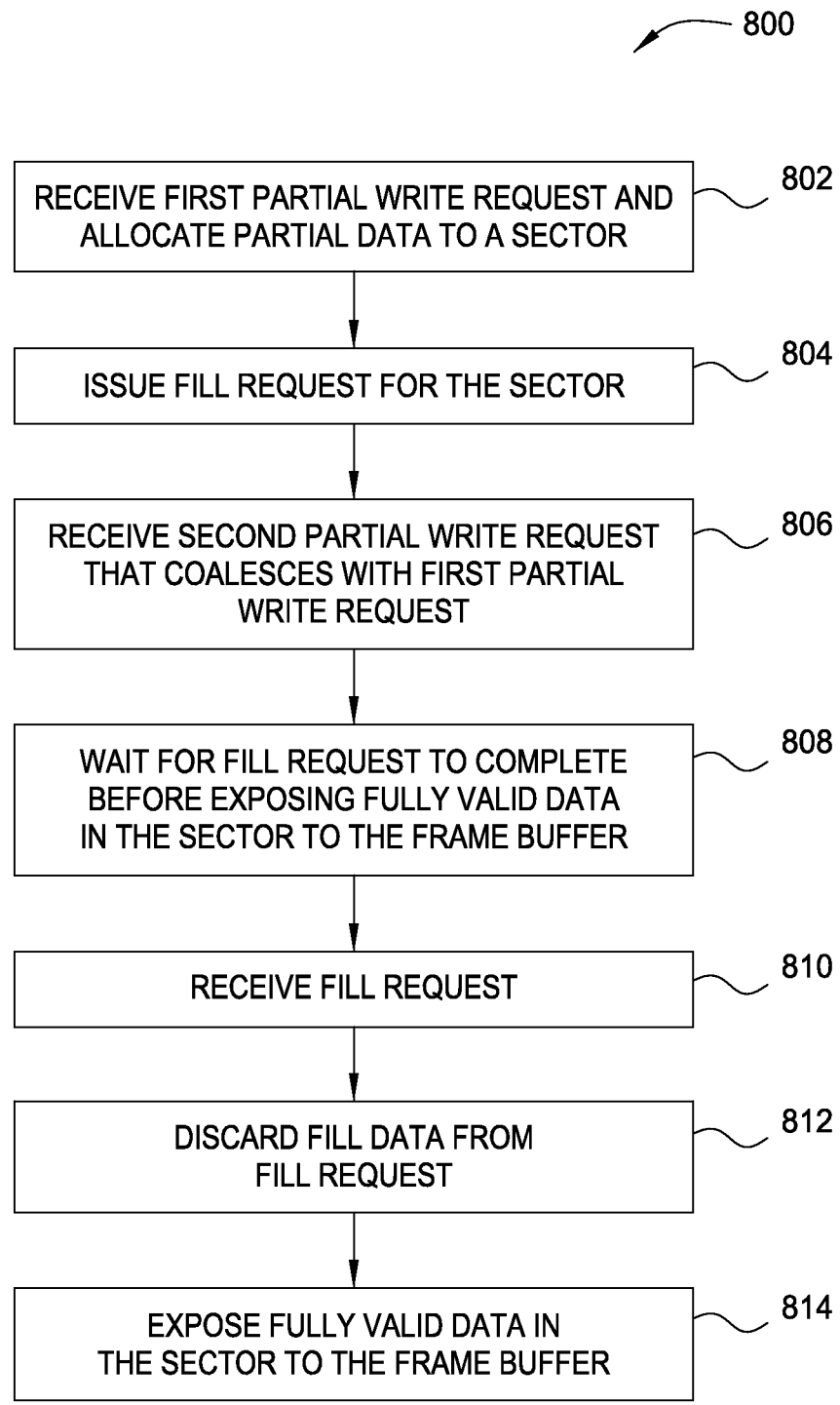
FIG. 8 is a flowchart illustrating steps for avoiding unnecessary write traffic in a graphics processing system.

FIG. 8 sets forth a flow diagram of method steps for avoiding unnecessary write traffic in a graphics processing system, according to one embodiment of the present invention. Although the method steps are described in conjunction with the systems of FIGS. 1-7, persons of ordinary skill in the art will understand that any system configured to perform the method steps, in any order, is within the scope of the inventions.

As shown, a method 800 begins at step 802, where a first partial write request is received at a data cache memory and the partial data is allocated to a sector in a cache line. In step 804, a fill request is issued by a tag lookup unit to a frame buffer for the remaining bytes in the sector. The fill request may be issued for a variety of reasons, such as the number of partial lines being above a specific threshold.

A fill request issued to a frame buffer may take a relatively large amount of time to complete due to the processes required to transmit and read data from a memory. While the fill request is in progress, a second partial write request may be received by the data cache memory and that second partial data may coalesce with the data from the first partial write and create a full write. Receiving the second partial write request is illustrated in step 806.

After step 806 completes, fully valid data is located in the sector. This fully valid data could be exposed to the frame buffer at this time. However, the fill request issued previously is still in progress, and that fill data will be returned at a future time. If the fully valid data in the sector is exposed to the frame buffer at this time before the fill request is received, the fully valid data may be exposed again when the fill request completes. Instead, in step 808, the tag lookup unit waits for the fill request to complete before exposing the fully valid data to the frame buffer.

In step 810, the data from the fill request is received. If a fill request is received and the sector already contains fully valid data, the fill data is discarded as illustrated in step 812.

In step 814, the fully valid data in the sector is exposed to the frame buffer. Performing the steps in method 800 resulted in only one write operation to the frame buffer instead of multiple write operations, leading to time and data bandwidth savings.

One advantage of the disclosed techniques is that they enable partial fill requests to be avoided under certain conditions, which reduces both latencies associated with writing data to an off-chip DRAM and memory bandwidth consumption. Consequently, the disclosed techniques improve overall system performance. In addition, unnecessary write operations to a DRAM may be avoided in certain embodiments of the present disclosure, which also improves overall system performance.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as compact disc read only memory (CD-ROM) disks readable by a CD-ROM drive, flash memory, read only memory (ROM) chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons of ordinary skill in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

Therefore, the scope of embodiments of the present invention is set forth in the claims that follow.

What is claimed is:

1. A method for managing memory traffic, comprising:
    causing first data to be written to a data cache memory, wherein a first write request comprises a partial write and writes the first data to a first portion of the data cache memory;
    tracking the number of partial writes in the data cache memory;
    issuing a fill request for one or more partial writes in the data cache memory if the number of partial writes in the data cache memory is greater than a predetermined first threshold.

2. The method of claim 1, further comprising causing second data to be written to the data cache memory, wherein a second write request comprises a partial write and writes the second data to a second portion of the data cache memory to create a full write in the data cache memory.

3. The method of claim 2, further comprising transmitting the data in the full write to a memory.

4. The method of claim 3, further comprising computing an error control checksum for the data in the full write.

5. The method of claim 3, further comprising decrementing the number of partial writes in the data cache memory each time data in the full write is transmitted to the memory.

6. The method of claim 1, further comprising causing second data to be written to the data cache memory, wherein a second write request comprises a partial write and writes the second data to a second portion of the data cache memory without creating a full write in the data cache memory.

7. The method of claim 6, wherein each of the first portion of the data cache memory and the second portion of the data cache memory comprises a sector within a cache line.

8. The method of claim 6, wherein the first portion of the data cache memory and the second portion of the data cache memory are located in different cache lines.

9. The method of claim 1, wherein a fill request is not issued for any partial write in the data cache memory if the number of partial writes in the data cache memory is less than the predetermined first threshold.

10. The method of claim 1, further comprising a predetermined second threshold that is greater than the predetermined first threshold, and wherein a fill request is issued for a new partial write to the data cache memory if the number of partial writes in the data cache memory is greater than the predetermined second threshold.

11. The method of claim 1, wherein the memory comprises a frame buffer memory.

12. The method of claim 1, further comprising incrementing the number of partial writes in the data cache memory each time a new partial write is written to the data cache memory.

13. The method of claim 1, wherein, if a fill request has been issued, the data in the first portion of the data cache memory is not transmitted to a memory until the fill request is complete.

14. A subsystem, comprising:
    a tag lookup unit configured to manage memory traffic by performing the steps of:
        causing first data to be written to a data cache memory, wherein a first write request comprises a partial write and writes the first data to a first portion of the data cache memory;
        tracking the number of partial writes in the data cache memory;
        issuing a fill request for one or more partial writes in the data cache memory if the number of partial writes in the data cache memory is greater than a predetermined first threshold.

15. The subsystem of claim 14, wherein the tag lookup unit is further configured to perform the step of causing second data to be written to the data cache memory, wherein a second write request comprises a partial write and writes the second data to a second portion of the data cache memory to create a full write in the data cache memory.

16. The subsystem of claim 15, further comprising a frame buffer unit configured to perform the step of transmitting the data in the full write to a memory.

17. The subsystem of claim 16, wherein the frame buffer unit is further configured to perform the step of computing an error control checksum for the data in the full write.

18. The subsystem of claim 14, wherein the tag lookup unit is further configured to perform the step of causing second data to be written to the data cache memory, wherein a second write request comprises a partial write and writes the second data to a second portion of the data cache memory without creating a full write in the data cache memory.

19. The subsystem of claim 18, wherein each of the first portion of the data cache memory and the second portion of the data cache memory comprises a sector within a cache line.

20. The subsystem of claim 18, wherein the first portion of the data cache memory and the second portion of the data cache memory are located in different cache lines.

21. The subsystem of claim 14, wherein a fill request is not issued for any partial write in the data cache memory if the number of partial writes in the data cache memory is less than the predetermined first threshold.

22. The subsystem of claim 14, further comprising a predetermined second threshold that is greater than the predetermined first threshold, and wherein a fill request is issued for a new partial write to the data cache memory if the number of partial writes in the data cache memory is greater than the predetermined second threshold.

23. The subsystem of claim 14, wherein the tag lookup unit is further configured to increment the number of partial writes in the data cache memory each time a new partial write is written to the data cache memory.

24. The subsystem of claim 14, wherein the tag lookup unit is further configured to decrement the number of partial writes in the data cache memory each time data in the full write is transmitted to the memory.

25. The subsystem of claim 14, wherein, if a fill request has been issued, the tag lookup unit is further configured to wait until the fill request is complete before notifying a frame buffer unit that the data in the one or more previous partial writes can be transmitted to a memory.

* * * * *